United States Patent
Eguchi et al.

(10) Patent No.: US 11,056,160 B2
(45) Date of Patent: Jul. 6, 2021

(54) NON-VOLATILE MEMORY WITH SELECTABLE HARD WRITE

(71) Applicant: NXP USA, INC., Austin, TX (US)

(72) Inventors: Richard Eguchi, Austin, TX (US); Jon Scott Choy, Austin, TX (US); Anirban Roy, Austin, TX (US); Jacob Williams, Austin, TX (US); Kerry Ilgenstein, Austin, TX (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 16/660,108

(22) Filed: Oct. 22, 2019

(65) Prior Publication Data

US 2021/0118475 A1    Apr. 22, 2021

(51) Int. Cl.
*G11C 7/00* (2006.01)
*G11C 7/10* (2006.01)
*G06F 11/10* (2006.01)
*G11C 8/08* (2006.01)
*G11C 8/10* (2006.01)

(52) U.S. Cl.
CPC ........ *G11C 7/1096* (2013.01); *G06F 11/1068* (2013.01); *G11C 7/1069* (2013.01); *G11C 8/08* (2013.01); *G11C 8/10* (2013.01)

(58) Field of Classification Search
None
See application file for complete search history.

(56) References Cited

U.S. PATENT DOCUMENTS

| 7,051,264 | B2 |   | 5/2006  | Leung et al. |             |
|-----------|----|---|---------|--------------|-------------|
| 7,661,045 | B2 | * | 2/2010  | Browne       | G06F 11/106 |
|           |    |   |         |              | 714/723     |
| 9,612,908 | B2 | * | 4/2017  | Kim          | G06F 11/1402|
| 10,115,446| B1 |   | 10/2018 | Louie et al. |             |
| 10,475,513| B2 | * | 11/2019 | Wang         | G11C 13/0069|
| 2002/0008993 | A1 | * | 1/2002 | Hayashi   | H01L 27/115 |
|           |    |   |         |              | 365/185.18  |
| 2004/0264234 | A1 | * | 12/2004 | Moore     | G11C 13/0069|
|           |    |   |         |              | 365/148     |
| 2011/0292716 | A1 | * | 12/2011 | Lu        | G11C 13/0007|
|           |    |   |         |              | 365/148     |
| 2018/0122449 | A1 | * | 5/2018  | Berger    | G11C 11/1693|

OTHER PUBLICATIONS

G. Gulak, "A review of multiple-valued memory technology," Proceedings. 1998 28th IEEE International Symposium on Multiple-Valued Logic (Cat. No. 98CB36138), Fukuoka, Japan, 1998, pp. 222-231, doi: 10.1109/ISMVL.1998.679447. (Year: 1998).*
Huang, C., "Built-In Redundancy Analysis for Memory Yield Improvement", IEEE Transactions on Reliability, vol. 52, No. 4, Dec. 2003.
Schechter, S., "Use ECP, not ECC, for Hard Failures in Resistive Memories", ISCA '10, Jun. 19-23, 2010.
Srivastava, S., "Tagged Repair Techniques for Defect Tolerance in Hybrid nano/CMOS Architecture", IEEE Transactions on Nanotechnology, 2010.

* cited by examiner

*Primary Examiner* — Daniel F. McMahon

(57) ABSTRACT

As disclosed herein, a non-volatile memory circuit includes an array of memory cells. The non-volatile memory circuit also includes circuitry for performing a hard write to selective bits of addressed cells simultaneously with a normal write to the other bits of the addressed cells during a write operation to the addressed cells.

20 Claims, 5 Drawing Sheets

NON-VOLATILE MEMORY WITH SELECTABLE HARD WRITE

BACKGROUND OF THE INVENTION

Field of the Invention

This invention relates to non-volatile memories.

Background

Non-volatile memories are utilized for storing data in an electronic system including when the systems are powered down.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As disclosed herein, a non-volatile memory circuit includes circuitry for performing a hard write to selective bits of addressed cells simultaneously with a normal write to the other bits of the addressed cells during a write operation to the addressed cells. In some embodiments, a hard write is characterized as applying a higher voltage and/or higher current to a cell than for a normal write to a cell. In other embodiments, a hard write may include applying a pulse to cell for a longer duration than to a cell of a normal write. In some embodiments, providing a non-volatile memory circuit with the ability to selectively perform a hard write to some of the cells of an addressed memory location and to perform a normal write to other cells of the addressed memory location may provide for memory that can provide an enhanced write to write error prone cells of a memory location while other cells of the memory location are not subject to the higher stress conditions of the hard write operation. With some of these embodiments, the ability to selectively provide a hard write to some cells of a memory location may increase the success rate of the write operation.

Figure 1:
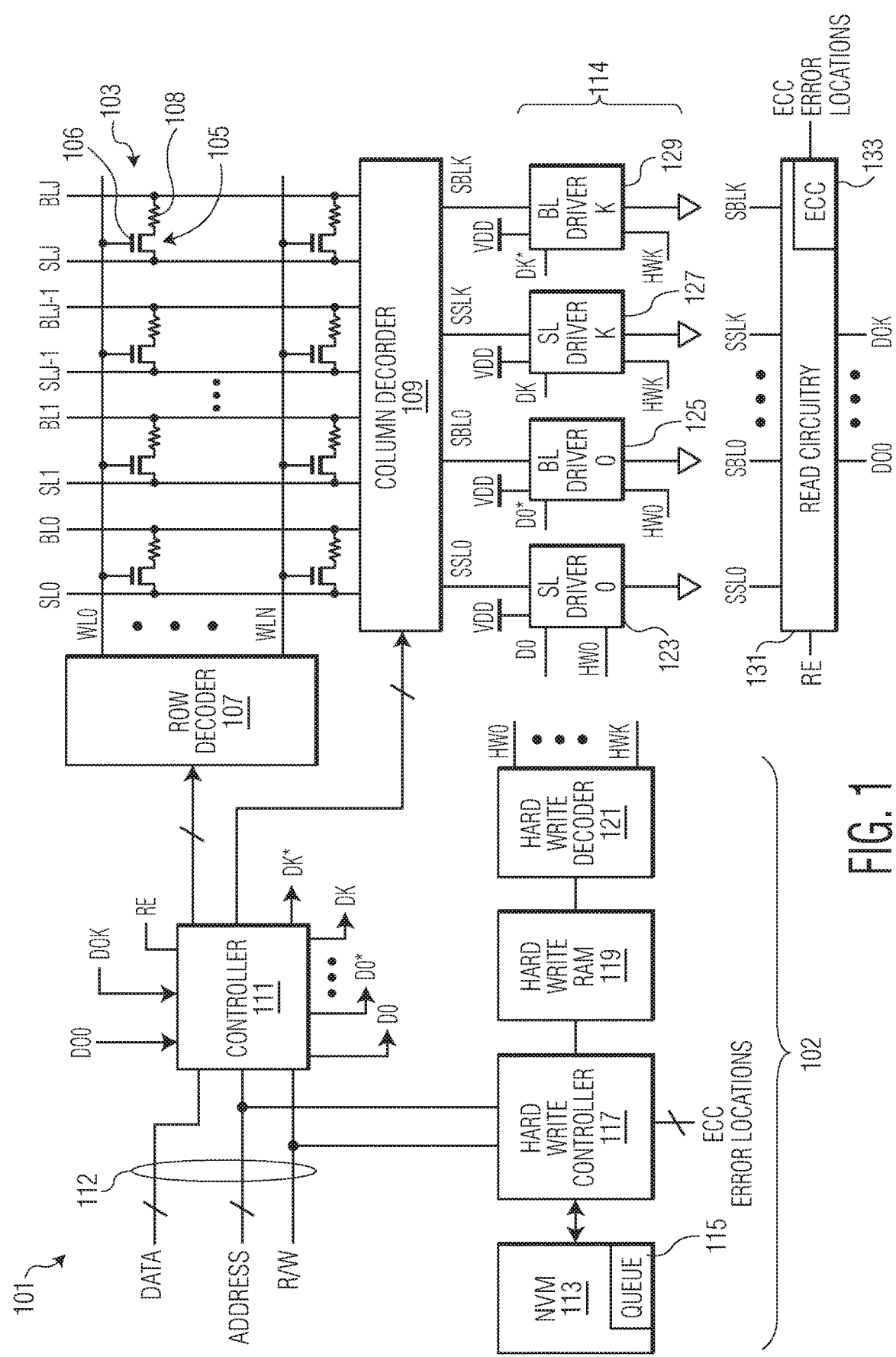
FIG. 1 is a circuit diagram of a non-volatile memory circuit according to one embodiment of the present invention.

FIG. 1 shows a circuit diagram of a non-volatile memory circuit 101 according to one embodiment of the present invention. Memory circuit 101 includes an array 103 of non-volatile memory cells (e.g. 105). In one embodiment, the memory cells of array 103 are characterized as resistive memory cells with a select transistor (106) and a resistive storage element (108). Types of resistive memory cells include MRAM, ReRAM, and phase change memory cells. However, array 103 may include other types of non-volatile memory cells such as flash memory cells or other types of electrically erasable memory cells in other embodiments.

The memory cells of array 103 are arranged in rows and columns. Each cell of a row is coupled to a word line (WL0:WLN) for controlling the select transistor (106) of the cell (105) to access the resistive storage element (108) of the cell during a memory operation. The word lines are controlled by a row decoder 107 that asserts one of the word lines based on a portion of an address received on ADDRESS lines of bus 112. Array 103 includes N+1 number of rows with 2 rows being shown in FIG. 1. However, an array may include a different number of rows in other embodiments. For example, an 8 Mb memory array may have 2048 rows plus a few (e.g., 2 or 4) redundant rows.

In the embodiment shown, the cells of each column of array 103 are coupled to a source line (SL0:SLJ) and a bit line (BL0:BLJ). FIG. 1 shows array 103 having four source lines and four bit lines. However, an array may have a different number source lines and bit lines (e.g. 64, 128, 512, 1024) in other embodiments. In other embodiments, an array may not include a source line such as it may include two bit lines per column or only one bit line per column.

In the embodiment shown, memory circuit 101 includes a column decoder 109 for selecting a subset of the bit lines and source lines (SBL0:SBLK, SSL0:SSLK) to provide to the write circuitry 114 and read circuitry 131 of memory circuit 101 during a memory operation. Decoder 109 selects K+1 number of selected bit lines and selected source lines based on the address provided on the ADDRESS lines of bus 112. In one embodiment, the ratio of J+1 to K+1 is 8 to 1, but may be of other ratios in other embodiments. Some embodiments do not include a column decoder.

The selected source lines and selected bit lines (SSL0:SSLK, SBL0:SBLK) are provided to the write circuitry 114 for writing data to addressed cells of array 103 during a write operation and provided to read circuitry 131 for reading data from addressed cells during a read operation. Write circuitry 114 includes source line driver circuits 123 and 127 for controlling write characteristics (e.g. voltage, current) of the selected source lines (SSL0:SSLK) and bit line driver circuits 125 and 129 for controlling write characteristics of selected bit lines (SBL0:SBLK) during a write operation. Each of the source line drivers and bit line drivers receives a data signal (D0, D0*, DK, DK*) from controller 111 that is based on the data received on the DATA lines of bus 112. In one embodiment, if the data bit to be written (e.g. D0) is low and the complementary data bit to be written (e.g. D0*) is high, then the source line driver circuit (e.g. SL driver0) receiving the data bit will couple the selected source line (e.g. SSL0) to ground and the bit line driver circuit (e.g. BL Driver0) receiving the complementary data bit will couple the selected bit line (e.g. SBL0) to receive a non-ground write voltage or write current during a write operation to a memory cell of array 103. If the data bit to be written (e.g. D0) is high and the complementary data bit to be written (e.g. D0*) is low, then the source line driver circuit (e.g. SL driver0) receiving the data bit will couple the selected source line (e.g. SSL0) to receive a non-ground write voltage or write current and the bit line driver circuit (e.g. BL Driver0) receiving the complementary data bit will couple the selected bit line (e.g. SBL0) to ground during a write operation to a memory cell of array 103.

Each source line driver circuit and bit line driver circuit also receives a hard write signal (HW0, HWK) for initiating a hard write of a selected memory cell of the memory cells of a memory location written to during a memory write operation. The assertion of a hard write signal to a source line driver circuit or bit line driver circuit causes the driver circuit to perform a hard write to the cell with respect to a normal write to the other cells of other write driver circuits during the write operation.

An NVM cell of an array may need a "harder" write operation than other cells in that the cell is prone to a higher probability of write error in data written to that cell (characterized as a write error prone cell). In some examples, a non-volatile memory cell may be write error prone due to process variation in the formation of its structures with respect to corresponding structures of other cells of the array. Typically, with non-volatile memories, a write operation requires a higher stress on the memory as compared to a read operation. In contrast, with most volatile memories, the read and write stress conditions are essentially similar. Due to the higher write stress in an NVM, the reliability of the memory may be compromised if a hard write is applied to all cells of the memory in one pulse.

In one embodiment, a hard write to a cell includes providing a greater amount of write current to the resistive element (e.g. 108) of a cell than a normal write to a cell. In other embodiments, a hard write may include providing a higher voltage to the cell than a normal write. In still other embodiments a hard write may include providing a write pulse for a longer period of time than a normal write to a cell. In some embodiments, a hard write operation may include a combination of the above.

Memory circuit 101 also includes read circuitry 131 for reading the values stored in the NVM cells of array 103 during a memory read operation. In one embodiment, read circuitry 131 includes sense amplifiers (not shown) coupled to the select bit lines (SBL0:SBLK) for reading the values from an addressed location of cells during a memory read operation.

In the embodiment shown, memory circuit 101 includes error correction code circuitry (ECC) 133 for performing error detection and correction of the data being read during a read operation. Array 103 stores parity bits to the write data received from bus 112 during a write operation of the data. The stored parity data is read along with the desired data during a read operation. In one embodiment, controller 111 includes circuitry (not shown) for generating parity bits from the write data received on the DATA lines from bus 112. The parity bits are written to cells of an addressed memory location during a write operation. ECC 133 uses the parity bits to correct errors in the data read during a read operation and provides the corrected data as the output data (DO0: DOK). ECC 133 also provides an indication of which cells generated a bit error (ERROR LOCATION) during a read operation. ECC 133 may implement any one of a number of error detection and correction schemes including block code type schemes, convolutional code type schemes, or combinations thereof.

Memory circuit 101 includes a controller 111 that receives signals from bus 112 and provides a subset of the address signals to row decoder 107 and another subset to column decoder 109 during a memory operation. Controller 111 also provides the data bits (D0, D0*, DK, and DK*) to the source line and bit line drivers for writing the values to the memory cells of array 103. Controller 111 also provides a read enable signal (RE) to read circuitry 131 for enabling the read circuitry 131 during a read operation. Although not shown, controller 111 provides a write enable signal to write circuitry 114 for enabling a write operation. Controller 111 returns the corrected read data (DO0:D0K) on bus 112 in response to a data read. In one embodiment, bus 112 receive requests for read and write operations to array 103 from a processor or DMA (not shown) operably coupled to bus 112.

Circuit 101 includes hard write control circuitry 102 for determining which cells of an addressed memory location of array 103 are to have a hard write performed during a write operation to the addressed memory location. Circuitry 102 includes a hard write controller 117 that detects when a write operation is to be performed to an addressed location of array 103. In the embodiment shown, controller 117 receives the address and read/write signal (R/W) from bus 112 for making the determination. However, in other embodiments, controller 117 receives the information from controller 111.

Hard write RAM 119 stores the location of the write error prone cells within a memory location of array 103 in which a hard write will be applied during a write operation. In one embodiment, in response to a detected write operation from bus 112, controller 117 uses the address of the write operation to address a memory location in RAM 119 that stores the specific cell locations of the write error prone cells of the addressed location in array 103. Hard write decoder 121 of circuitry 102 receives the specific cell locations from RAM 119 and asserts the specific hard write signals (HW0:HWK) to the pair of source line driver circuit/bit line driver circuit coupled to those cells during the write operation. In one embodiment, RAM 119 may include up to two indications of write error prone cells of an addressed location that need to be hard written during a memory write. However, in other embodiments, a different number of locations (e.g. one or more than 2) may be stored in RAM 119 per memory location.

For example, assume that the memory location of array 103 to be written to during a write operation has the address of 10011001, which is received on the ADDRESS lines of bus 112. Assume also that the memory location has 32 cells. Controller 117 uses the received address 10011001 as the address for reading data in RAM 119 to obtain the write error prone cell locations of the memory location of array 103 having the address 10011001 that require a hard write. For example, for array address 10011001, RAM 119 may indicate that the $3^{rd}$ cell and the 17th are write error prone cells. Accordingly, RAM 119 provides the values of 000011 (indicating the third cell) and 010001 (indicating the 17th cell) to decoder 121. In response, decoder assert the specific hard wire signals (HW2, HW16) corresponding to the $3^{rd}$ cell and the 17th cell of the memory location. If no locations are determined to be write error prone, then RAM 119 would provide a 000000 and 000000 to decoder 121, and decoder 121 would not assert any of the hard write signals. If only the $3^{rd}$ cell was determined to be write error prone, then RAM 119 would provide a 000011 and 000000 to decoder 121 where only the HW2 signal would be asserted.

While hard write controller 117 accesses RAM 119 to provide the write error prone cell locations to decoder 121 to assert the appropriate hard write signals, controller 111 signals row decoder 107 and column decoder 109 to couple the NVM cells of the addressed location of array 103 to the write driver circuitry 114 for writing the data values to those cells. The write error prone cells of the addressed location corresponding to the source line drivers and bit line drivers of circuitry 114 that receive an asserted hard write signal (HW0:HWK) are written with a hard write simultaneously with the other cells of the addressed memory location that are written with a normal write. Accordingly, all cells of an address location are written at the same time during a write operation.

Circuit 101 includes a non-volatile memory 113 for non-volatilely storing the locations of the write error prone cells of array 103. During a power reset (e.g. during a start-up operation), the data in NVM 113 is transferred by controller 117 to RAM 119 for use during memory write operations. In some embodiments, the locations of the write error prone memory cells of array 103 can be determined during production testing by the memory manufacturer or by the system manufacturer and loaded into NVM 113 prior to shipment to a customer.

In the embodiment shown, circuit 101 has the ability to determine the location of write error prone memory cells during operation. In the embodiment shown, controller 117 receives the error locations of cells where ECC 133 determined that the stored bit value was erroneous during a read operation. Controller 117 stores those locations in queue 115 of NVM 113. Responsive to receiving an error location, controller 117 examines queue 115 to see if the error location has appeared previously in queue 115. If it has appeared previously (or has appeared for a threshold number of times greater than 1), controller 117 adds the cell location to both NVM 113 and RAM 119 indicting that it is a write error prone cell.

In one embodiment, if the number of identified write error prone cells of a memory location becomes greater than the number of write error prone cell indication locations in RAM 119 available for the memory location, then memory circuit 101 marks the memory location as unavailable. For example, if RAM 119 is able to store indications for two write error prone cells per memory location, and if the number of write error prone locations for a memory location is determined to be greater than 2, then the memory location is marked unusable and the data stored in the memory location is transferred to another memory location. In one embodiment, the number of write error prone cell locations that can be hard written for a memory location is equal to the maximum number of correctable bits of data stored in the memory location by ECC 133. Once the number of write error prone locations of a memory location exceed the maximum number of correctable bits, the memory location is considered unreliable. However, the number of cells that can be hard written and the maximum number of correctable bits by ECC 133 may be different in other embodiments.

In other embodiments, the determination and execution of a hard write on specific cells of a memory location may be performed by other methods and/or include another circuitry. For example, RAM 119 may be replaced with a CAM that returns the locations of the write error prone cells where the received address from bus 112 is used as an index to the CAM. In still other embodiments, the function of hard write RAM may be implemented with a non-volatile memory wherein NVM 113 would not be needed. In some embodiments, at least some of the functions of controller 117 may be performed by controller 111.

Figure 2:
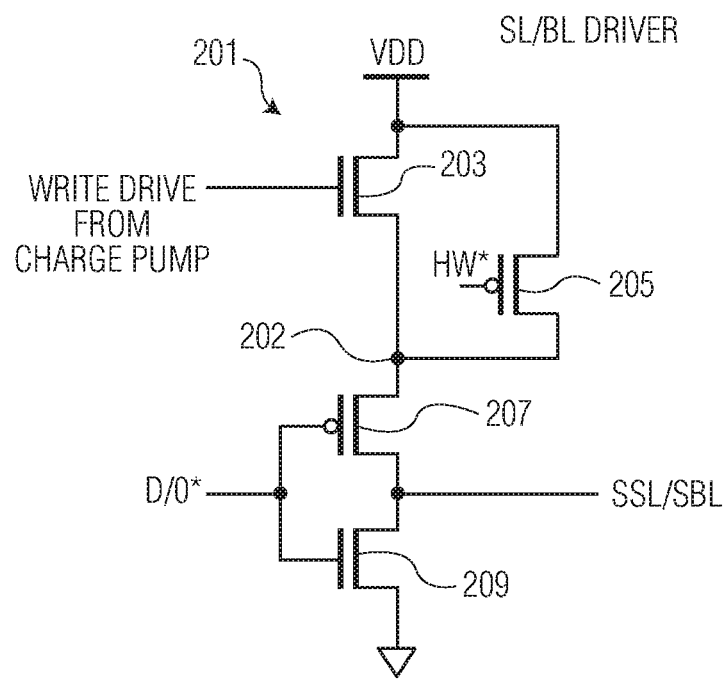
FIG. 2 is a circuit diagram of a write driver circuit according to one embodiment of the present invention.

FIG. 2 is a circuit diagram of a write line driver circuit according to one embodiment of the present invention. Driver circuit 201 can be utilized as either a source line driver circuit (123, 127) or a bit line driver circuit (125, 129) according to one embodiment of the present invention. Circuit 201 can be used to apply a lower, normal write voltage or a higher, hard write voltage to a memory cell of array 103 during a write operation to the memory cell. Circuit 201 includes a PFET 207 and an NFET 209 each having a gate that receives either a data signal (D) if circuit 201 is implemented as a source line driver circuit or a complementary data signal (D*) if circuit 201 implemented as a bit line driver circuit in the embodiment of FIG. 1. The data signal is indicative of a value to be stored in the memory cell. If the data signal (D or D*) is a low voltage value, then a write voltage of node 202 is applied to the selected source line or selected bit line through a conductive transistor 207. If the data value is a high voltage value, then the selected source line or the selected bit line is grounded through a conductive transistor 209.

Driver circuit 201 includes a source follower transistor 203 that includes a gate to receive a write drive voltage from a charge pump or voltage reference source (not shown) of controller 111 to set the voltage of node 202 at a normal write voltage that is less than VDD during a normal write of a non-volatile memory cell of array 103. In one embodiment, the normal write voltage at node 202 is in the range of 1.2-1.6V but may be of other values in other embodiments. In some embodiments, the write drive voltage is a voltage that is trimmed during production testing. In one embodiment, the write drive voltage is pulled to zero volts when the write circuitry 114 is not enabled.

Circuit 201 includes a PFET transistor 205 that when enabled by an asserted low Hard Write signal (HW), pulls the write voltage of node 202 closer to VDD to perform a hard write of the cell during a write operation. Accordingly, during a write operation to an addressed memory location of array 103, a higher write voltage (e.g. in the range of 1.4-1.8V) can be applied to the write error prone cells of the addressed location and a lower, normal write voltage (e.g. in the range of 1.2-1.6V) can be applied to the other cells of the addressed location, depending upon the value of the Hard Write signal (HW) provided to driver circuit 201.

Figure 3:
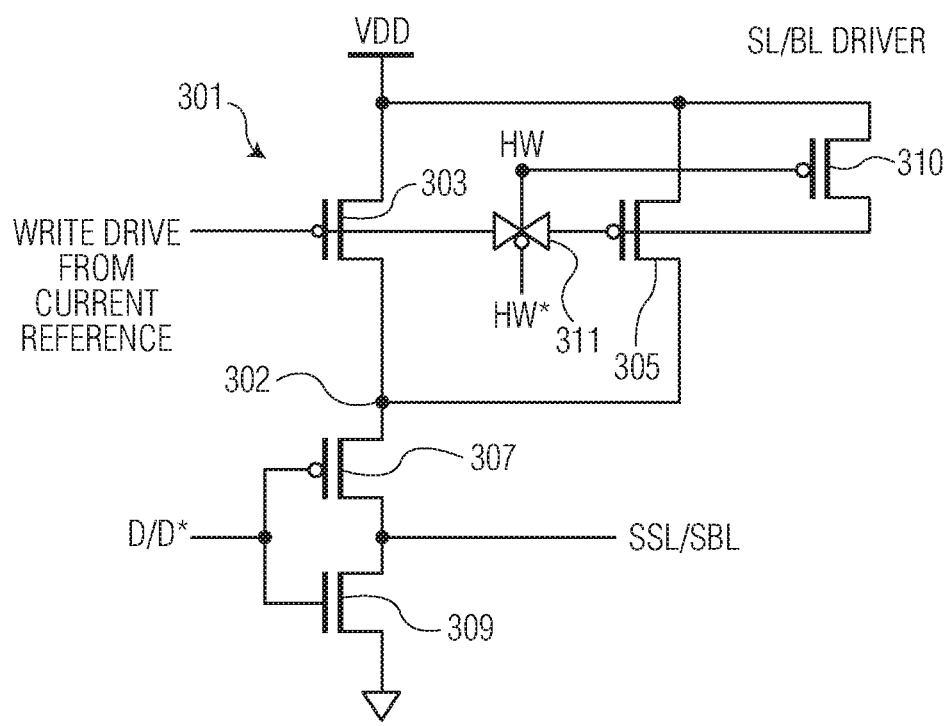
FIG. 3 is a circuit diagram of a write driver circuit according to another embodiment of the present invention.

FIG. 3 is a circuit diagram of a write line driver circuit 301 that can be utilized as either a source line driver circuit (123, 127) or a bit line driver circuit (125, 129) according to another embodiment of the present invention. Circuit 301 can be used to apply a lower, normal write current or a higher, hard write current to a memory cell of array 103 during a write operation to the memory cell. Circuit 301 includes a PFET 307 and an NFET 309 each having a gate that receives either a data signal (D) if circuit 301 is implemented as a source line driver circuit or a complementary data signal (D*) if circuit 301 implemented as a bit line driver circuit in the embodiment of FIG. 1. The data signal is indicative of a value to be stored in the memory cell. If the data signal (D or D*) is a low voltage value, then a write current from node 302 is applied to the selected source line or selected bit line through a conductive transistor 307. If the data signal is a high voltage value, then the selected source line or the selected bit line is grounded through a conductive transistor 309.

Driver circuit 301 includes a current control transistor 303 that includes a gate to receive a write drive voltage from a current reference of controller 111 to set the current through node 302 during a normal write of a non-volatile memory cell of array 103. In one embodiment, the normal write current through node 302 is 80 uA, but may be of other values in other embodiments. In some embodiments, the normal write current is trimmed during production testing. In one embodiment, transistor 303 is made non-conductive when the write circuitry 114 is not enabled.

Circuit 301 includes a pass gate 311, PFET transistor 305, and PFET transistor 310. Pass gate 311, when enabled by an asserted Hard Write signal (HW, HW*), passes the write drive signal to the gate of transistor 305 to make transistor 305 conductive to provide additional current to node 302 to perform a hard write of the cell during a write operation. Accordingly, during a write operation to an addressed location of array 103, a higher write current (e.g. 90 uA) can be applied to the write error prone cells of the address location and a lower normal write current (e.g. 80 uA) can be applied to the other cells of the addressed location, depending upon the value of the Hard Write signal provided to the driver circuit. When the Hard Write signal is not asserted, PFET transistor 310 is made conductive to pull the gate of PFET 305 to VDD to turn off PFET transistor 305.

In other embodiments, other types of driver circuits can be used. For example, in some embodiments, a driver circuit may include two pulse generators (not shown), each providing a write pulse of a different length. During a normal write operation to a cell, a shorter pulse is applied to a memory cell. During a hard write operation, a longer pulse is applied to the cell. During a write operation, the different length pulse are considered simultaneous if the pulses overlap for at least a portion of time.

Figure 4:
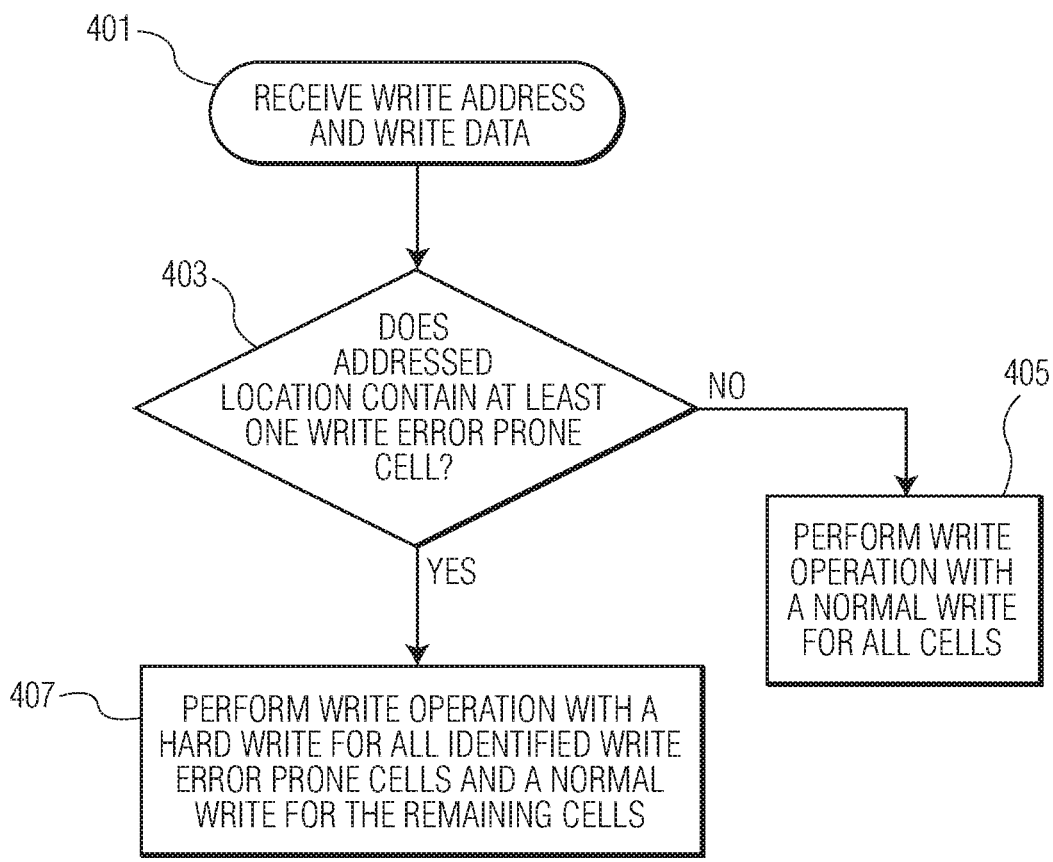
FIG. 4 is a flow diagram of a memory write operation according to one embodiment of the present invention.

FIG. 4 sets forth a flow diagram of memory circuit 101 performing a write operation according to one embodiment of the present invention. In operation 401, memory circuit 101 receives a write address to an addressed location in array 103 and write data to be written to the addressed location from bus 112. In operation 403, a determination is made whether the addressed location contains at least one write error prone cell. In the embodiment of FIG. 1, this is done by controller 117 using the received address to access RAM 119 to determine if there are any cells of the addressed location that are indicated as write error prone. If no write error prone locations are indicated, then in operations 405, a normal write is performed on all cells of the addressed location for the write operation. In the embodiment shown, the write operation of 405 is performed by write circuitry 114 where all the hard write signals (HW0:HWK) are non-asserted.

If there are indications of write error prone cells in an addressed location, then in operation 407, a hard write is performed on the identified write error prone cells and a normal write is performed on the other cells. In the embodiment shown in FIG. 1, a hard write is performed on the error prone cells by asserting the corresponding Hard Write signal (HW0:HWK) to the drivers coupled to the write error prone cells during the write operation. With respect to the embodiment of FIG. 2, an asserted HW signal for a hard write increases the write voltage applied to a cell. With respect the embodiment of FIG. 3, an asserted HW signal for a hard write increases the write current applied to a cell.

Figure 5:
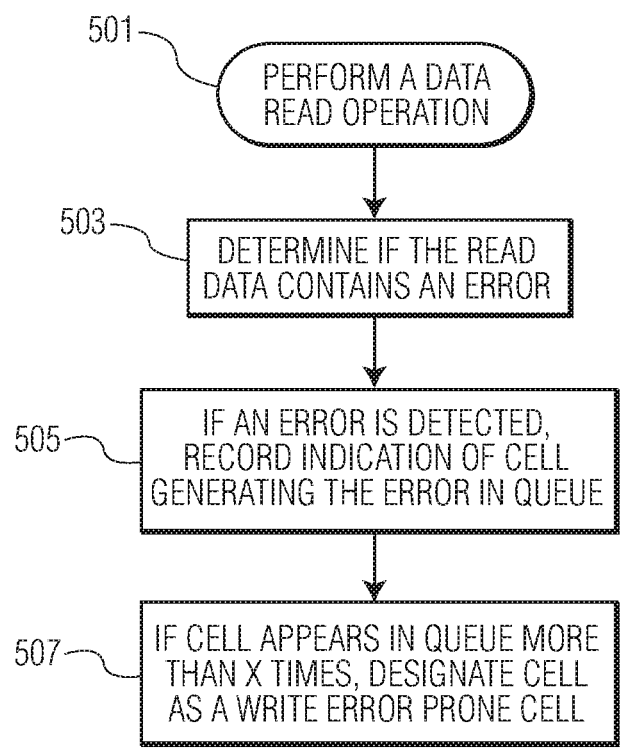
FIG. 5 is a flow diagram of a memory operation according to one embodiment of the present invention.

FIG. 5 sets forth a flow diagram for detecting whether a cell may be write error prone cell during the operation of a memory according to one embodiment of the present invention. In operation 501, a data read operation is performed on cells of an addressed location. In operation 503, the ECC 133 determines if the read data contains an error using an ECC detection scheme. If an error is detected, then controller 117 in operation 505, records in queue 115 an indication of the cell that generated the erroneous bit. In operation 507, controller 117 then examines queue 115 to determine if the cell appears more than a threshold (X) number of times. If so, then controller designates the cell as a write error prone cell by recording the cell location in RAM 119 and NVM 113. In one embodiment, the threshold can be from 1-25, but may be of other values in other embodiments.

If as a result of operation 507 the number of write error prone cells of an addressed location becomes greater than the number of locations identifiable in RAM 119 (e.g. two) for the addressed location, then the addressed location is marked as unusable. Otherwise, the next time that a write operation is performed to the addressed location, a hard write will be performed on cell designated as write error prone in operation 507.

Figure 6:
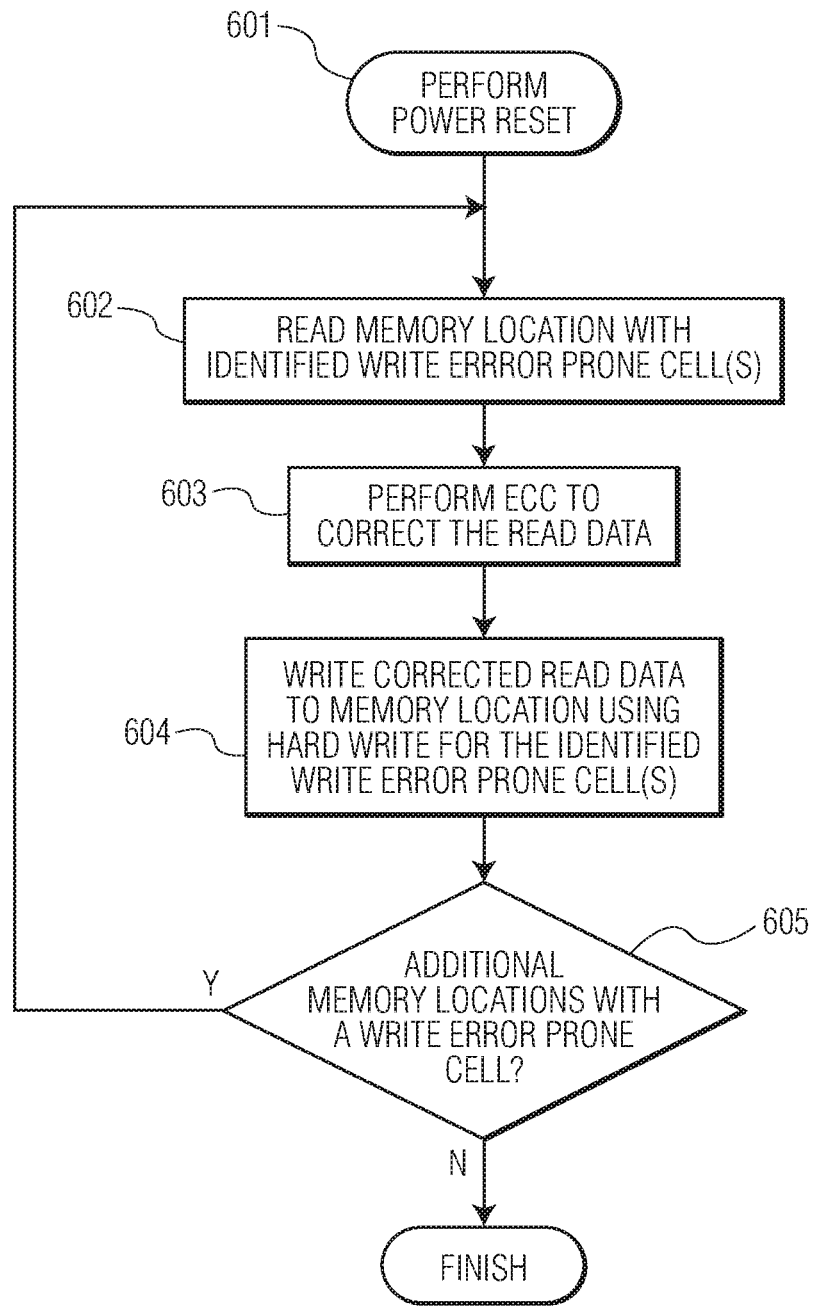
FIG. 6 is a flow diagram of a write operation after a power reset according to one embodiment of the present invention.

FIG. 6 is a flow diagram for a process of starting up a memory after a power reset according to one embodiment of the present invention. In the embodiment shown, a data "scrub is performed for all memory locations with write error prone cells so as to check the data integrity of those cells. In operation 601, a power reset of memory circuit 101 is performed. In operation 602, a data read is performed on a memory location with an identified write error prone cell as indicated in NVM 113. In operation 603, ECC 133 corrects the read data of the read operation of operation 602. In operation 604, a write operation is performed to write the corrected data to the memory location where the write operation includes a hard write of the identified write error prone cells of the location and a normal write to the other cells of the memory location. Operations 602, 603 and 604 are repeated for all memory locations with a write error prone cell until in decision 605 when its determined that all memory locations with a write error prone cell have been scrubbed. In some embodiments, if the scrub identifies additional write error cells, the locations of those write error prone cells will be recorded in NVM 113 and RAM 119. In other embodiments, the scrub of FIG. 6 can be performed at other times during the operation of memory circuit 101.

As set forth in some embodiments, providing a memory that allows for selective cells of a memory location to be written with a hard write while other cells are written with a normal write may provide for a write operation that can apply "harder" write conditions to write error prone cells without overstressing the non-write error prone cells during a write operation.

With some prior art non-volatile memories, a read verify operation is performed after a write to determine whether the cells were correctly written. If a cell is write error prone, then an additional hard write would be performed after the read verify operation to rewrite the data to the cell. With embodiments of the present invention, maintaining an indication of the write error prone cells and selectively adjusting the write parameters for the write error prone cells during the initial write operation, may allow for an effective write to NVM memory cells with a single write operation in some embodiments. In other embodiments that implement read verify write operations, it may minimize the number of rewrites to the write error prone cells. With such a system, the amount of time needed to write to a non-volatile memory is greatly decreased. This is especially beneficial for resistive non-volatile memory cell types (e.g. MRAM, ReRAM) that are designed to have higher write speeds than other NVM cell types such as flash memories.

Some memory circuits are not designed for read verify write operations. Thus, maintaining a list of write error prone cells and selectively adjusting the write parameters of the data writes to these cells may greatly increase the effectiveness and accuracy of these types of memories.

In one embodiment, A non-volatile memory circuit includes an array. The array includes non-volatile memory cells. The non-volatile memory circuit includes write circuitry coupled to the array and configured to, in performing a write operation of write data into an addressed memory location of the array, perform a normal write to a first set of memory cells of the addressed memory location and simultaneously perform a hard write to a second set of at least one memory cell of the addressed memory location. The first set of memory cells of the addressed memory location and second set of at least one memory cell of the addressed memory location are mutually exclusive of each other.

In another embodiment, a non-volatile memory circuit includes an array. The array includes non-volatile memory cells. The non-volatile memory circuit includes write circuitry coupled to the array. The write circuitry includes a plurality of write drivers and the write circuitry is configured to, in performing a write operation of write data into an addressed memory location of the array, couple each write driver of the plurality of write drivers to a corresponding memory cell of the addressed memory location. The non-volatile memory circuit includes a hard write control circuitry configured to, for the write operation, provide a hard write indicator to each write driver of the plurality of write drivers. The write circuitry is configured to, for each write driver receiving an asserted hard write indicator, perform a hard write of a corresponding memory cell of the addressed memory location for the write operation, and for each write driver receiving a negated hard write indicator, perform a normal write of a corresponding memory cell of the addressed memory location for the write operation. Any hard writes and any normal writes for the write operation into the addressed memory location are performed simultaneously.

Another embodiment includes a method in a non-volatile memory circuit having a memory array with non-volatile memory cells and having a hard write memory. The method includes performing a write operation to an addressed memory location of the memory array. The performing the write operation includes determining if at least one cell of the addressed memory location is indicated as write error prone in the hard write memory. The performing the write operation includes if at least one cell is indicated as write error prone in the hard write memory, completing the write operation by performing a hard write of the at least one cell while simultaneously performing a normal write of remaining cells of the addressed memory location of the memory array. The performing the write operation includes if at least one cell of the addressed memory location is not indicated as write error prone in the hard write memory, completing the write operation by performing a normal write of all cells of the addressed memory location.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A non-volatile memory circuit comprising:
an array, wherein the array includes non-volatile memory cells; and
write circuitry coupled to the array and configured to, in performing a write operation of write data into an addressed memory location of the array, perform a normal write to a first set of memory cells of the addressed memory location and simultaneously perform a hard write to a second set of at least one memory cell of the addressed memory location, wherein the first set of memory cells of the addressed memory location and second set of at least one memory cell of the addressed memory location are mutually exclusive of each other.

2. The non-volatile memory circuit of claim 1, wherein the memory cells in the second set of at least one memory cell are characterized as write error prone cells.

3. The non-volatile memory circuit of claim 1, further comprising:
a hard write control circuitry configured to provide a hard write indicator corresponding to each memory cell of the addressed memory location for the write operation, wherein when the hard write indicator is asserted, a hard write of a corresponding memory cell of the addressed memory location is performed for the write operation and when a hard write indicator is not asserted, a normal write of a corresponding memory cell is performed for the write operation.

4. The non-volatile memory circuit of claim 3, wherein the hard write control circuitry further comprising:
a hard write memory configured to indicate write error prone memory cells of the array.

5. The non-volatile memory circuit of claim 4, wherein the hard write control circuitry asserts a hard write indicator corresponding to a memory cell during the write operation if the hard write memory indicates that the memory cell is write error prone.

6. The non-volatile memory circuit of claim 5 wherein for a write operation to an addressed memory location of the array, the hard write control circuitry does not assert any hard write indicators for any memory cells of the addressed memory location if no memory cell of the addressed memory location is indicated as write error prone in the hard write memory and wherein a normal write of all memory cells of the addressed memory location is performed for the write operation.

7. The non-volatile memory circuit of claim 4, wherein:
the hard write control circuitry includes storage circuity configured to store a queue of memory cell locations of the array that generated an erroneous bit when read;
the hard write control circuitry includes a hard write controller coupled to the storage circuity; and
the non-volatile memory circuit includes read circuitry coupled to the array and the hard write controller, wherein the read circuitry is configured to read data from a read address location of the array and determine if the read data contains a bit error,
the hard write controller is configured to, when the read data contains a bit error, determine if a location of a memory cell in the array which generated the bit error is present in the queue at least a threshold number of times, and if so, characterize the memory cell in the array which generated the bit error as a write error prone memory cell and store the location of the write error prone memory cell in the hard write memory.

8. The non-volatile memory circuit of claim 1, wherein the write operation is not performed as a read-modify-write operation such that performing the write operation does not require an immediately preceding read of the addressed memory location.

9. The non-volatile memory circuit of claim 1, wherein performing the write operation of the write data into the addressed memory location comprises applying a first write voltage to each memory cell in the first set of memory cells for the normal write while simultaneously applying a second write voltage, higher than the first write voltage, to each memory cell in the second set of at least one memory cell for the hard write.

10. The non-volatile memory circuit of claim 1, wherein performing the write operation of the write data into the addressed memory location comprises applying a first write current through to each memory cell in the first set of memory cells for the normal write while simultaneously applying a second write current, higher than the first write current, to each memory cell in the second set of at least one memory cell for the hard write.

11. The non-volatile memory circuit of claim 1, wherein performing the write operation of the write data into the addressed memory location comprises applying a first single write pulse to each memory cell in the first set of memory cells to complete the normal write while applying a second single write pulse, having a greater pulse width than the first single write pulse, to each memory cell in the second set of at least one memory cell to complete the hard write, wherein the first single write pulse at least partially overlaps in time with the second single write pulse.

12. A non-volatile memory circuit comprises:
an array, wherein the array includes non-volatile memory cells;
write circuitry coupled to the array, wherein the write circuitry includes a plurality of write drivers and the write circuitry is configured to, in performing a write operation of write data into an addressed memory location of the array, couple each write driver of the plurality of write drivers to a corresponding memory cell of the addressed memory location;
a hard write control circuitry configured to, for the write operation, provide a hard write indicator to each write driver of the plurality of write drivers;
wherein the write circuitry is configured to, for each write driver receiving an asserted hard write indicator, perform a hard write of a corresponding memory cell of the addressed memory location for the write operation, and for each write driver receiving a negated hard write indicator, perform a normal write of a corresponding memory cell of the addressed memory location for the write operation, wherein any hard writes and any normal writes for the write operation into the addressed memory location are performed simultaneously.

13. The non-volatile memory circuit of claim 12, wherein the hard write control circuitry further includes:
a hard write memory configured to indicate write error prone cells of the array.

14. The non-volatile memory circuit of claim 13, wherein the hard write control circuitry is configured to, for the write operation, determine if the addressed memory location includes a write error prone cell based on contents of the hard write memory, and if so, provide an asserted hard write indicator to each corresponding write driver of the plurality of write drivers of a determined write error prone cell of the addressed memory location.

15. The non-volatile memory circuit of claim 12, wherein performing a normal write of a corresponding cell of an addressed memory location comprises applying a first write voltage to the corresponding cell of the addressed memory location, and performing a hard write of a corresponding cell of an addressed memory location comprises applying a second write voltage, higher than the first write voltage, to the corresponding cell of the addressed memory location.

16. The non-volatile memory circuit of claim 12, wherein performing a normal write of a corresponding cell of the addressed memory location comprises applying a first write current to the corresponding cell of the addressed memory location, and performing a hard write of a corresponding cell of the addressed memory location comprises applying a second write current, higher than the first write current, to the corresponding cell of the addressed memory location.

17. A method in a non-volatile memory circuit having a memory array with non-volatile memory cells and having a hard write memory, the method comprising:
performing a write operation to an addressed memory location of the memory array, wherein performing the write operation includes:
determining if at least one cell of the addressed memory location is indicated as write error prone in the hard write memory;
if at least one cell is indicated as write error prone in the hard write memory, completing the write operation by performing a hard write of the at least one cell while simultaneously performing a normal write of remaining cells of the addressed memory location of the memory array; and
if at least one cell of the addressed memory location is not indicated as write error prone in the hard write memory, completing the write operation by performing a normal write of all cells of the addressed memory location.

18. The method of claim 17 further comprising:
performing read operations at corresponding read addresses of the memory array, wherein for each read operation, determining whether the read operation at a corresponding read address contains a bit error, and when the read operation at the corresponding read address is determined to contain a bit error, recording a location of a cell which generated the bit error in a memory queue.

19. The method of claim 18 further comprising:
determining from the memory queue, if the cell which generated the bit error has previously generated a read bit error for at least a threshold number of times;
if the cell has previously generated a read bit error for at least a threshold number of times, designating the cell as a write error prone cell in the hard write memory.

20. The method of claim 17, further comprising:
upon a power reset, for each memory cell indicated as write error prone in the hard write memory:
obtaining read data stored in a memory location of the memory array that includes the memory cell;
performing error correction on the read data to obtain corrected read data, and
writing the corrected read data to the memory location in the memory array by performing a hard write for the memory cell of the memory location that is indicated as write error prone in the hard write memory while simultaneously performing a normal write on remaining cells of the memory location that are not indicated as write error prone.

* * * * *